United States Patent
Horimoto

(10) Patent No.: US 7,576,419 B2
(45) Date of Patent: Aug. 18, 2009

(54) SEMICONDUCTOR DEVICE

(75) Inventor: Masashi Horimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 129 days.

(21) Appl. No.: 10/938,229

(22) Filed: Sep. 10, 2004

(65) Prior Publication Data

US 2005/0056930 A1  Mar. 17, 2005

(30) Foreign Application Priority Data

Sep. 11, 2003  (JP) .............................. 2003-319203

(51) Int. Cl.
*H01L 23/02* (2006.01)
(52) U.S. Cl. ................ 257/678; 257/724; 257/E23.175
(58) Field of Classification Search ................ 257/666, 257/676, 665, 778, 686, 738, E27.091, E21.095, 257/E27.096, 133, 167, 177, 107, 724, 265, 257/337, E21.094, E21.371, E21.87, E23.175, 257/678; 361/704, 707, 717, 718
See application file for complete search history.

(56) References Cited

U.S. PATENT DOCUMENTS 6,362,525 B1 * 3/2002 Rahim ........................ 257/738

7,019,337 B2 * 3/2006 Eden et al. ................... 257/107
7,091,564 B2 * 8/2006 Hasegawa .................... 257/372

FOREIGN PATENT DOCUMENTS

JP  31 47165 B2  1/2001

* cited by examiner

Primary Examiner—Davienne Monbleau
Assistant Examiner—Hoa B Trinh
(74) Attorney, Agent, or Firm—Hamre, Schumann, Mueller & Larson, P.C.

(57) ABSTRACT

A semiconductor device has an IC chip main body including a power transistor and a substrate of BGA type including an insulating substrate. A plurality of external electrodes are formed on a plurality of through holes formed in the insulating substrate so as to individually penetrate from one surface to the other surface and protrude to the other surface. Further, the external electrodes are arranged in a grid pattern. Power pads among IC pads of the IC chip main body are bonded to substrate pads connected to outermost peripheral external electrodes among the external electrodes of the substrate, such that the lengths of the wires become shorter.

6 Claims, 4 Drawing Sheets

SEMICONDUCTOR DEVICE

BACKGROUND OF THE INVENTION

1. Field of the Invention

The present invention relates to a semiconductor device having a large power element, such as a power transistor.

2. Description of the Related Art

A semiconductor device having a packaged chip, such as a semiconductor integrated circuit (IC), is currently manufactured and utilized in various types of electronic devices. In this semiconductor device, terminals (pads) of a semiconductor chip main body are packaged so as to have external terminals to be used for connection with an external circuit.

Such a semiconductor chip main body is provided with a plurality of connection pads. The pads are connected to the external terminals, respectively. A method using lead terminals has been employed as a method for connecting the pads to the external terminals. However, a connection method using a ball grid array (BGA) structure has come into widespread use.

A chip-size package (CSP), which is substantially equal in outer dimension to the semiconductor chip main body, is implemented by use of the connection method using a BGA structure. In the CSP, pads opposing the respective pads or the semiconductor chip main body are provided on one side of a substrate, and ball-shaped external electrodes are provided in a two-dimensional grid pattern on the other surface of the substrate. On the substrate, the respective pads and the respective external electrodes are individually connected together.

In this CSP, the external electrodes are formed from spherical solder bumps and arranged two-dimensionally over essentially the entire lower surface of the semiconductor device. Consequently, the external electrodes can be formed to a compact, slim size close to the size of the chip. Further, the external electrodes can be mounted on the surface of a printed wiring board.

A semiconductor device of T-BAG structure utilizing a carrier tape is also employed (see Patent Document 1). In this semiconductor device or T-BAG structure, a conductive layer made of copper foil and another conductive layer made of conductive paint are provided on a rectangular carrier tape, and an IC chip main body is placed at and conductively connected to the center of the carrier tape. By means of the conductive connection, signal bumps are provided in a two-dimensional pattern on essentially the entire lower surface, and ground bumps are provided along an outer edge section.

However, in the CSP using the conventional connection method using a BGA structure, a plurality of external electrodes are arranged in a grid pattern. The length of the wires extending from the external electrodes located close to the center of the grid pattern to the pads of the IC chip main body becomes long. Therefore, additional wiring resistance is added to the wires, which is responsible for an increase in the loss of the external electrodes through which large current for the power element flows, or deterioration of a control characteristic of the power element.

In the semiconductor device with a T-BAG structure described as disclosed in Japanese Patent No. 3147165, two conductive layers must be provided on the carrier tape, which ends up increasing the cost. since only a ground electrical path (or a power electrical path) can be formed with low resistance by said structure, it is not appropriate to adopt such manner for the purpose of lowering the resistance of an output circuit of the power element.

SUMMARY OF THE INVENTION

To this end, it is the object of this invention is provided to enhance a control characteristic of a power element by reducing a wiring resistance of the power element to thereby diminish a loss in a semiconductor device having a power element, such as a power transistor, and external electrodes arranged in a grid pattern.

[Means for Solving the Problem]

A semiconductor device as the first aspect of this invention is characterized by comprising an IC chip main body including a power element, and a plurality of IC pads provided along an outer edge section of one surface, the IC pads further including signal pads and power pads connected to the power element; and a substrate comprising an insulating substrates a plurality or external electrodes which respectively penetrate through a plurality of through holes of the insulating substrate from one surface to the other surface of the insulating substrate and are arranged in a grid pattern, a plurality of substrate pads, being provided on the one surface of the insulating substrate, which are electrically connected to the respective IC pads being formed in an arrangement so as to surround the plurality of external electrodes, and a plurality of wires for connecting the plurality of substrate pads to the plurality of external electrodes, wherein the power pads among the IC pads are bonded to the substrate pads that are connected to the outermost peripheral external electrodes of the external electrodes so that the length of the wires is rendered short.

A semiconductor device as the second aspect of this invention in view of the first aspect of this invention is characterized in that the substrate pads bonded to the power pads are selected from substrate pads without including substrate pads that are provided at corners.

A semiconductor device as the third aspect of this invention is characterized in that the above-mentioned power element is a power transistor.

A semiconductor device as the fourth aspect of this invention in view of the third aspect of this invention is characterized in that the power transistor is a regulator transistor for regulating a source voltage to a predetermined output voltage.

A semiconductor device as the fifth aspect of this invention in view of the fourth aspect of this invention is characterized in that a detection voltage corresponding to a voltage appearing at the IC pads connected to an output terminal of the regulator transistor is fed back to a control circuit of the regulator transistor.

According to the present invention, the length of a wire from the power element of the IC chip main body to an external electrode is rendered short, and hence wiring resistance becomes small. Thereby, the loss can be diminished.

Since a voltage drop in a wire associated with a large current becomes small, the control characteristic of a regulator can be improved. As a result of the voltage drop becoming small, the power pads of the IC chip main body can also be used as sensing pads. Accordingly, removing the dedicated sensing pads can reduce the number of the pads.

When the semiconductor device of the present invention is mounted on a printed circuit board, wiring to the discrete components (e.g., capacitors, coils, and transistors) to be simultaneously mounted thereonto can be also made by leading out from the external electrodes which are provided along the outermost periphery of the printed circuit board. Hence, the length of the wiring on the printed circuit board can also be made short.

The substrate pads provided at corners are not used for the power element. Even when the insulating substrate has become deformed for reasons of thermal stress after the semiconductor device has been mounted on the printed circuit board, influence of contact failures or exfoliation can be diminished.

DESCRIPTION OF THE PREFERRED EMBODIMENTS

The first embodiment of a semiconductor device according to the present invention will be described hereinbelow by reference to the drawings.

Figure 1A:
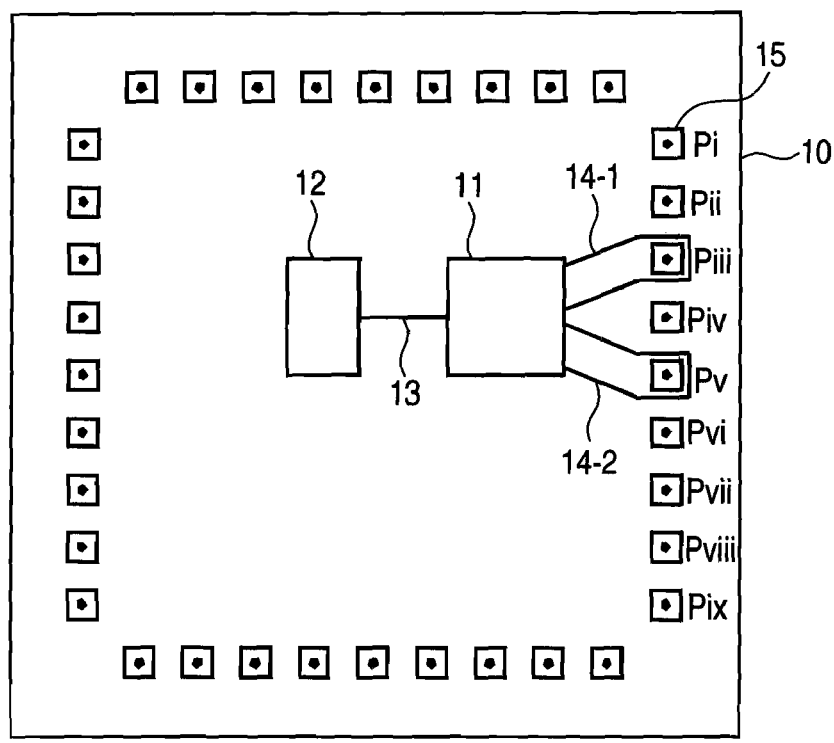
FIG. 1(a) is a view showing the configuration of an IC chip main body of a semiconductor device of the first embodiment in the present invention.
Figure 1B:
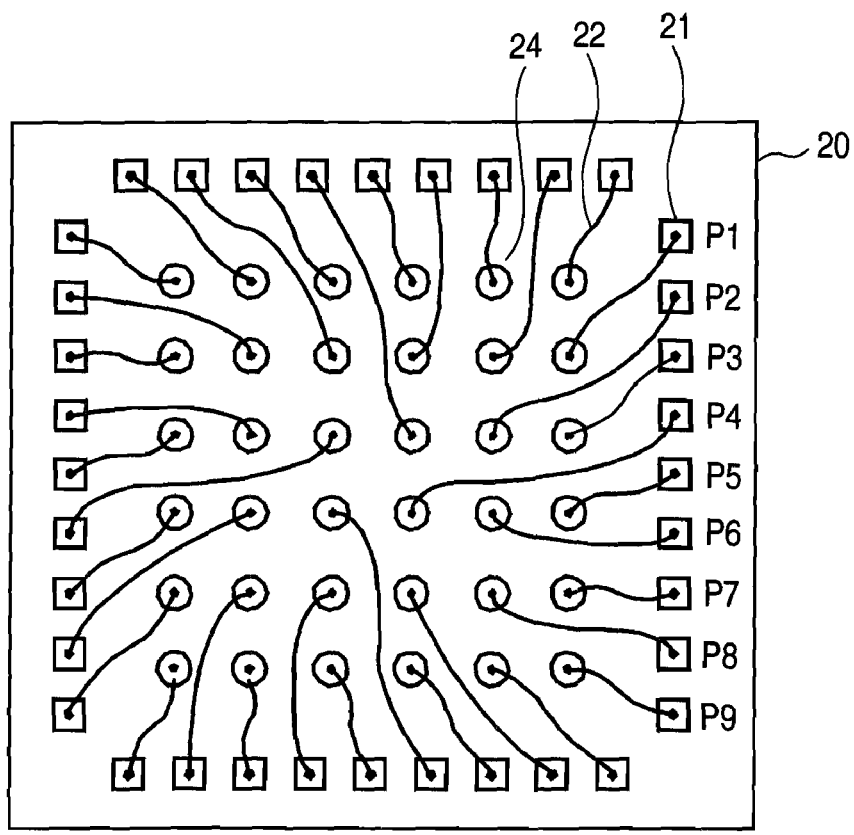
FIG. 1(b) is a view showing the configuration of a substrate 20 used along with the IC chip main body.

FIGS. 1(a), 1(b) are views showing the configuration of a semiconductor device according to the first embodiment of the present invention. FIG. 1(a) is a view showing the configuration of a semiconductor integrated circuit main body (hereinafter called an IC chip main body) 10 of the semiconductor device of the invention, and FIG. 1(b) is a view showing the configuration of a substrate 20 used in combination with an IC chip main body 10.

As shown in FIG. 1(a), a power element 11, a control circuit 12 for controlling the power element, and other components, such a signal processing circuit, an input/output circuit, or the like which are not shown in the drawings, are embedded in the IC chip main body 10. Here, although only one power element 11 is illustrated in FIG. 1(a), an arbitrary number of power elements can be also provided. Further, although a power transistor is adopted as an example of a power element, however, it is also possible to adopt another power element which is capable of handling a large current.

A plurality of IC pads 15 are provided along an outer edge of the IC chip main body 10 in FIG. 1(b). The plurality of IC pads 15, the power transistor 11, the control circuit 12, other signal processing circuits, other input/output circuits, and the like are connected together by means of internal wiring.

Of the interconnections, an interconnection between the power transistor 11 and the IC pads 15 will be described. In order to reduce the resistance of the wiring, the power transistor is provided in a rectangular form in proximity to IC pads 15 provided along one side of the IC chip main body 10. For the sake of explanation, symbols Pi to Pix are affixed to the IC pads 15 provided along one side, in descending order from the top. In the illustration, to facilitate understanding, nine IC pads are provided along one side. However, an arbitrary number of IC pads may be provided.

The power transistor 11 is controlled by a control signal output from the control circuit 12 by way or a signal line 13. Power wires 14-1, 14-2 extending from the power transistor 11 are connected to an IC pad Piii and an IC pad Pv situated at remote locations. The power line extending from the power transistor 11 is usually connected to an adjacent IC pad. However, according to the present invention, the power wires are connected as shown in FIG. 1-A in order to minimize the length of wiring of the power transistor 11 in accordance with a connection between the substrate pads and the external electrodes on the substrate 20.

A substrate base material, such as a printed board, a film board, or a carrier tape, is used as the substrate 20 shown in FIG. 1(b). This substrate 20 has one surface having substrate pads 21 provided thereon, and another surface having the external electrodes provided thereon. The substrate pads 21 provided on one surface are arranged so as to correspond to the IC pads 15 of the IC chip main body 10, and the substrate pads 21 are bonded to the respective IC pads 15 by means of bumps.

In the embodiment, the substrate pads 21 are nine per side in the same manner as are the IC pads 15, and a total of 36 external electrodes 24 are provided along the outer edge section. A plurality of the external electrodes 24 are provided in a grid pattern within an area enclosed by the substrate pads 21 of the outer edge section. The external electrodes 24 correspond to the substrate pads 21, and the number of the external electrodes 24 is 36 (=6×6).

In the respective external electrodes 24, through holes formed in the insulating substrate at respective positions in a grid pattern are provided with electrodes so as to penetrate through the substrate from one surface to the other surface and so as to be able to connect to the outside by way of the other surface. Ball-shaped electrodes are preferable as the electrodes. In the case of the ball-shaped electrodes, the external electrodes arranged in the grid pattern come to a ball grid array (BGA). As a matter of course, other external electrodes, such as bump electrodes, other than the ball-shaped electrodes may also be employed.

The respective external electrodes 24 and the respective substrate pads 21 are connected together on one surface by means of wires 22. As shown in FIG. 1(b), the respective wires 22 are connected to the inner external electrodes by way of outer external electrodes so as not to contact the external electrodes 24 and to facilitate wiring. Therefore, the respective wires 22 are provided so as to pass through a route which facilitates wiring, regardless of whether the wires are for signal purpose or power purpose.

Figure 2:
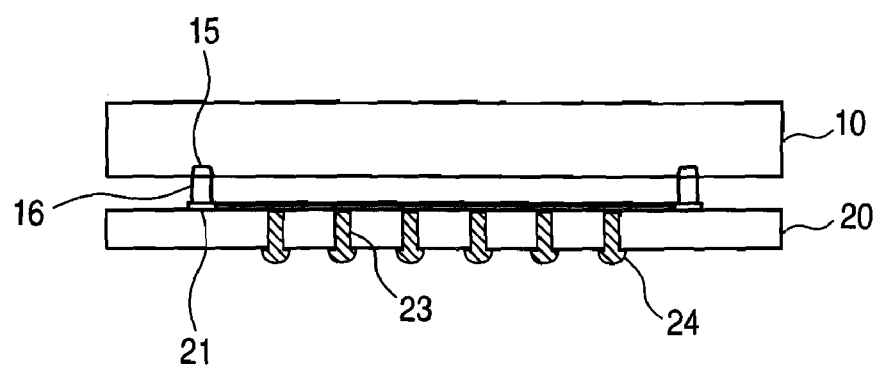
FIG. 2 is a schematic cross-sectional view for describing the configuration of the semiconductor device shown in FIGS. 1(a), 1(b)

FIG. 2 is a schematic cross-sectional view for describing the configuration of the semiconductor device shown in FIGS. 1(a), 1(b). In FIG. 2, constituent elements shown in FIG. 1(a), such as the power transistor 11 and the control circuit 12, are embedded in the IC chip main body chip 10. The IC pads 15 are formed on the surface of the IC chip main body 10, and bumps 16 are provided so as to be electrically contact the IC pads 15. The pads 21 of the substrate 20 are connected to the IC pads 15 of the IC chip main body 10 by means of the bumps 16. The respective bumps 21 and the respective external electrodes 24 are connected together by means of the wires 22. The external electrodes 24 penetrate from one surface to the other surface by way of through holes (via holes) 23.

As to the alignment of the external electrodes 24 and the through holes 23, it is also possibly to take another arrangement such as to offset the external electrode from the position of the corresponding through hole by extending the wiring prom the through hole to the external electrode along the other surface of the substrate.

As mentioned previously, in the substrate 20, the respective wires 22 are provided so as to pass through a route which facilitates wiring to the external electrodes 24 arranged in a grid pattern. In normal times, the locations in the grid pattern where the external electrodes 24 to be connected to the individual substrate pads 21 are situated cannot be selected freely. Specifically, by reference to the embodiment shown in FIG. 1(b), the pads P1, P3, P5, . . . , are connected to the external electrodes provided at the outermost periphery among the external electrodes 24 arranged in the grid pattern. Pads P2, P4, P6, . . . , are connected to the external electrodes located further inside among the external electrodes 24 arranged in the grid pattern.

When the wires of the power transistor are connected to the external electrodes which are located further inside among the external electrodes 24 arranged in the grid pattern, resistance between the wires becomes larger. As a result, a loss becomes greater, and a voltage drop also becomes greater.

According to the present invention, various considerations are paid such that the lengths of the wires to the external electrodes 24 of the power transistor 11 become short.

First, (1) the power transistor 11 is arranged in close proximity to the IC pads 15 in the IC chip main body. As a result, the lengths of the power wires 14-1, 14-2 become short.

(2) The IC pads 15 which make the wires on the substrate short are selected, and the power wires 14-1, 14-2 are connected to these IC pads 15. Conventionally, the power lines extending from the power transistor 11 are usually connected to adjacent IC pads. However, according to the present invention, the IC pads to which the power lines are connected are selected in consideration of wiring conditions of the substrate.

(3) On the substrate, the substrate pads 21 connected to the power transistor 11 are taken as the substrate pads 21 located at the outermost periphery among the external wires arranged in the grid pattern where the lengths of the wires to the external electrodes 24 become short.

As mentioned above, according to the present invention, the power pads Piii, Pv of the IC pads 15 are bonded to substrate pads P3, P5 connected to the external electrodes located at the outermost periphery among the external electrodes 21 of the substrate 20 such that the lengths of the wires become shorter.

Consequently, according to the present invention, the lengths of the wires from the power element of the IC main body chip to the external electrodes become short, and hence wire resistance becomes small. As a result, a loss can be diminished.

In the semiconductor device of the present invention, substrate pads other than the substrate pads located at the corners, among all the substrate pads provided in the grid pattern, are taken as substrate pads bonded to the power pads of the IC pads. In other words, the outermost-peripheral pads P3, P5 which are located at the centers of the respective sides of the substrate pads 21 arranged in a square pattern and which require short wiring lengths are used for power wiring.

The semiconductor device of the present invention is frequently used while being mounted on a printed circuit board. In this case, the semiconductor device is subjected to heat treatment for reflow processing. However, because of thermal stress, the semiconductor device may sometimes be affected such that the substrate 20 is deformed by thermal stress. The deformation becomes greater at the center rather than at the corners or the substrate 20.

According to the present invention, the substrate pads other than the substrate pads located at the corners are used for power. Even when the substrate 20 has been deformed by thermal stress, the probability or occurrence of connection failures and exfoliation between the printed wiring board and the external electrodes of the substrate 20 or the probability or occurrence of connection failures or exfoliation between the substrate pads 21 of the substrate 20 and the IC chips 15 of the IC chip main body 10 is reduced. Therefore, the influence of an increase in resistance attributable to the connection failures can also be lowered.

So long as wiring to discrete components (e.g., capacitors, coils, transistors, or the like) mounted on a printed circuit board is made by leading prom the outermost external electrodes when the semiconductor device of the present invention is mounted on the printed circuit board, the lengths of the wires on the printed circuit board can also be made short.

Figure 3:
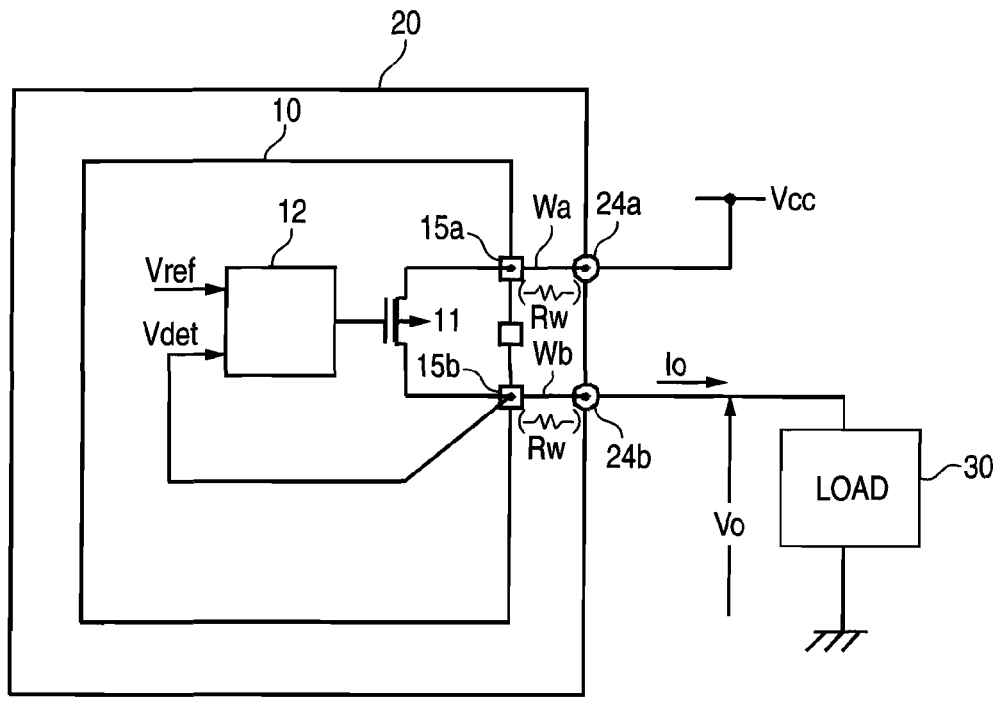
FIG. 3 is a block diagram for a case where a power transistor of the invention is used as a regulator.
Figure 4:
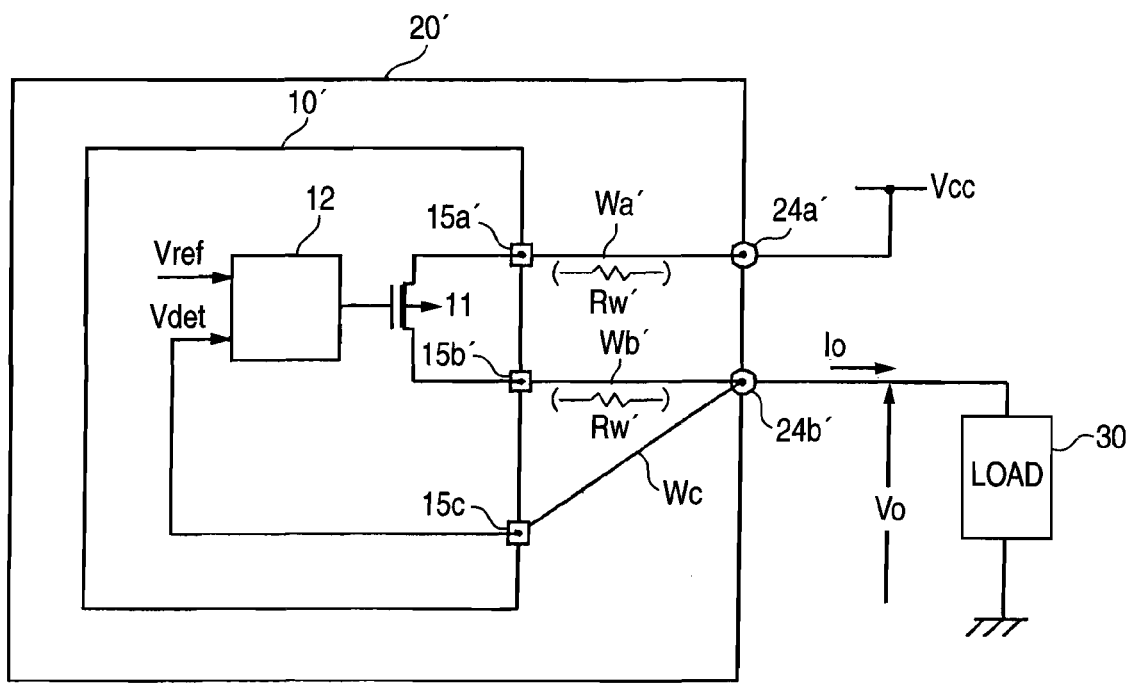
FIG. 4 is a block diagram for comparison, showing a case where the power transistor is used as a conventional regulator.

FIG. 3 is a block diagram for comparison with FIG. 4 showing a conventional control transistor, when the power transistor 11 of the present invention is used as a regulator control transistor.

In FIG. 3, the power transistor 11 is a p-type MOS transistor, and the control circuit 12 controls the power transistor 11 in such a way that the output voltage Vo comes to be a predetermined value, which is determined on the basis of a reference voltage Vref, by comparing the reference voltage Vref with a detection voltage Vdet of which value is corresponding to the output voltage Vo.

One end of the power transistor 11 is connected to an IC pad 15a (corresponding to, e.g., the IC pad piii shown in FIG. 1(a)) and further to an external electrode 24a by way of a wire Wa (corresponding to the wire 14-1 shown in FIG. 1(a) and the predetermined wire 22 shown in FIG. 1(b)). A source voltage Vcc is supplied to the external electrode 24a. The other end of the power transistor 11 is connected to the IC pad 15b (corresponding to the IC pad Pv shown in FIG. 1(a)) and further to an external electrode 24b by way of a wire Wb (corresponding to a wire 14-2 shown in FIG. 1(a) and the predetermined wire 22 shown in FIG. 1(b)). The external electrode 24b is connected to a load 30, and an output voltage Vo and a load current Io are supplied to the external electrode 24b. The wires—which are provided on the printed wiring board and connected to the external electrodes 24a, 24b—are connected to the source voltage Vcc and the load 30 by way of the wire whose diameter is larger than that of the external electrode.

According to the invention, the external electrodes 24a, 24b are the external electrodes provided at the outermost periphery. Hence, the lengths of the wires Wa, Wb are short, and resistance Rw of the wires assumes small values. Voltage drops arising in the wires Wa, W small enough to be ignored. The detection voltage Vdet to be used for feeding back the output voltage Vo to the control circuit 12 can be extracted from the IC pads 15.

FIG. 4 shows a case where the conventional power transistor 11 is used as a regulator control transistor. In FIG. 4, those elements which are the same as those of the invention shown in FIG. 3 are indicated by the same reference numerals. The elements—, which correspond to the same elements but are partially different in function or structure,—are indicated by the same reference with an apostrophe.

In the conventional semiconductor device shown in FIG. 4, one end of the power transistor 11 is connected to an IC pad 15a' and further to an external electrode 24' by way of a wire Wa'. The other end of the power transistor 11 is connected to an IC pad 15b' and further to an external electrode 24b' by way of a wire Wb'. In many cases, the lengths of the wires Wa', Wb' are long, and a resistance value Rw' of the wires become comparatively large. Voltage drops attributable to the wires Wa', Wb' become larger to an unignorable extent. Therefore, a power loss due to the resistance value Rw' becomes also larger. As in the case of the semiconductor device shown in FIG. 3, when the detection voltage Vdet is extracted from the IC pad 15b', a voltage which is smaller by the amount corresponding to the voltage drop of the wire is applied to a load, thereby deteriorating a voltage control characteristic of the transistor.

In order to prevent deterioration of the voltage control characteristic, there must be provided a configuration in which an IC pad 15c for voltage detection is additionally provided and in which the voltage of the external terminal 24b' is fed back to the control circuit 12 by way of the IC pad 15c.

As mentioned above, in a case where a regulator is configuration, a voltage drop in the wire associated with a large current becomes smaller, and hence a voltage control characteristic can be improved. As a result of a reduction in voltage drop, the power pad 15b of the IC chip main body can also be used as a sensing pad. Therefore, the sensing pads are diminished, thereby reducing the number of pads.

The second embodiment of a semiconductor device according to the present invention will be described by reference to FIG. 5.

Figure 5:
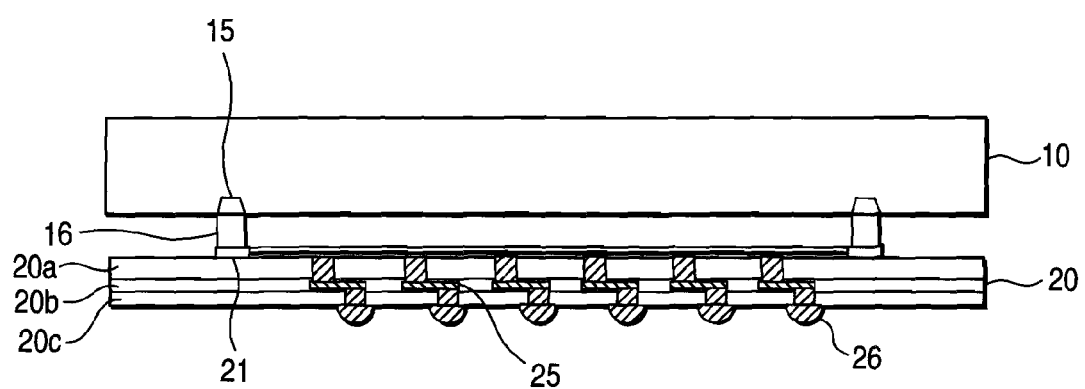
FIG. 5 is a schematic cross-sectional view as the second embodiment of the invention for describing the configuration of the semiconductor device shown in FIGS. 1(a), 1(b)

FIG. 5 is another schematic cross-sectional view for describing the configuration of the semiconductor device shown in FIGS. 1(a), 1(b). The constituent elements shown in FIG. 1(a), such as the power transistor 11 and the control circuit 12, are embedded in the IC chip main body chip 10 as already described in the first embodiment. The IC pads 15 are formed on the surface or the IC chip main body 10, and bumps 16 are provided so as to be electrically contact the IC pads 15. The pads 21 of the substrate 20 are connected to the IC pads 15 of the IC chip main body 10 by means of the bumps 16. It is noted, however, the substrate 20 in the second embodiment is characterized by its stacked-layer substrate as shown in FIG. 5, in which a plurality of insulating layers 20a, 20b, and 20c are stacked to form a substrate in a direction perpendicular to said one surface of the IC chip. In this configuration, a plurality of external electrodes are respectively formed in a plurality of communication paths which are formed in said stacked insulating substrate from one surface to the other surface through said plurality of insulating layers so that the routes of the communication paths in the cross-sectional view becomes a crank shape arrangement.

The respective bumps 21 and the respective external electrodes 26 are connected together by means of the wires 22. The external electrodes 26 penetrate from one surface to the other surface by way of communication paths 25.

Other descriptions to the configurations are omitted hereafter, but the external electrodes 24 to be connected to the individual substrate pads 21 and so on might be formed in the same manner as mentioned previously by reference to FIG. 1(b).

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A semiconductor device comprising:
   an IC chip main body including a power element, located at an outer edge section of the main body, that generates power to be provided to the outside of the IC chip, and a plurality of IC pads provided along the outer edge section of one surface of the main body, said IC pads further including signal pads, and power pads connected to said power element to output the power of the power element therefrom; and
   a substrate comprising an insulating substrate, a plurality of external electrodes which respectively penetrate through a plurality of through holes of said insulating substrate from one surface to the other surface of said insulating substrate and are arranged in a grid pattern, a plurality of substrate pads provided on said one surface of said insulating substrate, which are electrically connected to said respective IC pads being formed in an arrangement so as to surround said plurality of external electrodes, and a plurality of wires for connecting said plurality of substrate pads to said plurality of external electrodes, wherein
   said power pads among said IC pads are bonded to said substrate pads that are connected to the outermost peripheral external electrodes of said external electrodes except substrate pads that are located at corners of the substrate so that the length of said wires becomes short,
   said power element is a power transistor,
   said power pads include a source-connecting power pad connecting with a source of said power element, and a drain-connecting power pad connecting with a drain of said power element,
   said source-connecting power pad and said drain-connecting power pad are arranged at the outermost periphery of said external electrodes, and
   said external electrodes include a first external electrode connected to said source-connecting power pad and a second external electrode connected to said drain-connecting power pad, and said first external electrode and said second external electrode are adjacent to each other.

2. The semiconductor device according to claim 1, wherein said power transistor is a regulator transistor for regulating a source voltage to a predetermined output voltage.

3. The semiconductor device according to claim 2, wherein a detection voltage corresponding to a voltage appearing at said IC pads connected to an output terminal of said regulator transistor is fed back to a control circuit of said regulator transistor.

4. A semiconductor device comprising:
   an IC chip main body including a power element, located at an outer edge section of the main body, that generates power to be provided to the outside of the IC chip, and a plurality of IC pads provided along the outer edge section of one surface of the main body, said IC pads further including signal pads, and power pads connected to said power element to output the power of the power element therefrom; and
   a substrate comprising a stacked insulating substrate where a plurality of insulating layers are stacked in a direction perpendicular to said one surface of the main body, a plurality of external electrodes which respectively formed through a plurality of communication paths which is formed in said stacked insulating substrate from one surface to the other surface of said stacked insulating substrate, said external electrodes being arranged in a grid pattern, a plurality of substrate pads provided on said one surface of said stacked insulating substrate, which are electrically connected to said respective IC pads being formed in an arrangement so as to surround said plurality of external electrodes, and a plurality of wires for connecting said plurality of substrate pads to said plurality of external electrodes, wherein said power pads among said IC pads are bonded to said substrate pads that are connected to the outermost peripheral external electrodes of said external electrodes except substrate pads that are located at corners of the substrate so that the length of said wires becomes short, said power element is a power transistor, said power pads include a source-connecting power pad connecting with a source of said power element, and a drain-connecting power pad connecting with a drain of said power element, said source-connecting power pad and said drain-connecting power pad are arranged at the outermost periphery of said external electrodes, and said external electrodes include a first external electrode connected to said source-connecting power pad and a second external electrode connected to said drain-connecting power pad, and said first external electrode and said second external electrode are adjacent to each other.

5. The semiconductor device according to claim 4, wherein said power transistor is a regulator transistor for regulating a source voltage to a predetermined output voltage.

6. The semiconductor device according to claim 5, wherein a detection voltage corresponding to a voltage appearing at said IC pads connected to an output terminal of said regulator transistor is fed back to a control circuit of said regulator transistor.

* * * * *